United States Patent [19]

Gerrits et al.

[11] Patent Number: 5,635,876

[45] Date of Patent: Jun. 3, 1997

[54] PHASE DIFFERENCE AND AMPLITUDE CORRECTION CIRCUIT

[75] Inventors: John F. M. Gerrits, Cortaillod; Matthijs D. Pardoen, St-Blaise, both of Switzerland

[73] Assignee: ETA SA Fabriques d'Ebauches, Grenchen, Switzerland

[21] Appl. No.: 316,628

[22] Filed: Sep. 30, 1994

[30] Foreign Application Priority Data

Oct. 5, 1993 [FR] France .................... 93 11941

[51] Int. Cl.$^6$ .................... H03B 27/00; H03B 5/12; H03L 7/085; H03L 7/099
[52] U.S. Cl. .................... 331/45; 331/36 C; 331/46; 331/74; 331/177 V; 327/236; 327/255
[58] Field of Search .................... 331/2, 8, 10–12, 331/34, 36 C, 36 L, 36 R, 45, 46, 74, 149, 177 V; 327/233, 236, 237, 238, 240, 244, 254, 255; 375/261; 455/260; 330/84, 149

[56] References Cited

U.S. PATENT DOCUMENTS

| | | | |
|---|---|---|---|
| 4,795,922 | 1/1989 | Rice et al. | 327/254 X |
| 5,124,656 | 6/1992 | Yassa et al. | 327/244 X |
| 5,150,128 | 9/1992 | Kongelbeck | 342/174 |
| 5,179,731 | 1/1993 | Tränkle et al. | 327/238 X |

FOREIGN PATENT DOCUMENTS

| | | |
|---|---|---|
| 0048229 | 3/1982 | European Pat. Off. . |
| 0343273 | 11/1989 | European Pat. Off. . |

OTHER PUBLICATIONS

Patent Abstracts of Japan, vol. 4, No. 32 (E–2)(514) Mar. 19, 1980 & JP–A–55 004 134 (Matsushita Denki Sangyo KK) Jan. 12, 1990.
Patent Abstracts of Japan, vol. 17, No. 542 (E–1441) Sep. 29, 1993 & JP–A–05 152 855 (Fujitsu Ten Limited) Jun. 18, 1993.

Primary Examiner—David Mis
Attorney, Agent, or Firm—Weil, Gotshal & Manges

[57] ABSTRACT

The correction circuit comprises a first quadrature phase comparator intended to receive as input two signals which are desired to be in quadrature and to have equal amplitudes. Phase adjustment means are firstly intended to correct the phase of at least one of the signal to re-establish a phase difference of 90° therebetween. The correction circuit further comprises means to effectuate the sum and the difference of the signals which it receives as input and to supply the sum and the difference to a second quadrature phase comparator intended to supply as output a second error signal representative of the difference of the effective phase shift of these calculated signals and 90°. The second error signal is finally supplied to amplitude adjustment means intended to correct the amplitude of at least one of said signals.

5 Claims, 4 Drawing Sheets

PHASE DIFFERENCE AND AMPLITUDE CORRECTION CIRCUIT

FIELD OF THE INVENTION

The present invention concerns a circuit for the correction of the phase difference and the amplitudes of two sinusoidal signals which are desired to be in quadrature and to have equal amplitude. The present invention also concerns a generator circuit supplying a pair of sinusoidal signals in quadrature and of equal amplitudes, and it concerns notably such a generator capable of being realised and forming part of an integrated circuit functioning as a frequency shift keying (FSK) demodulation circuit.

The correction circuit of the present invention will be hereinafter described in relation to an FSK demodulation circuit. Nevertheless it will be understood that the invention is absolutely not limited to this particular application.

DESCRIPTION OF PRIOR ART

The use of a generator supplying a pair of signals in quadrature in an FSK demodulation circuit is already known in itself. In fact, in classic FSK demodulators, the FSK input signal to be demodulated is firstly applied to two mixing circuits; the first mixing circuit receives a first analysis signal whose frequency is situated half-way between the two frequencies of the input signal, and the other mixing circuit receives a second analysis signal identical to the first but having a phase difference of 90° with respect thereto.

The analysis signals received by the two mixers are called respectively the I signal (for In-phase) and the Q signal (for quadrature phase).

The output signals of the mixers then pass by two low-pass filters in order to transmit only the frequency difference between the signal input and the frequency of the local oscillator. The output signals of the two low-pass filters thus have a frequency equal to the displacement of the frequency of the received signal, this being (f1–f2)/2, if f1 and f2 are the two frequencies of the input signal. Further, these signals are also shifted in phase by 90°, and it is either the signal from the second mixer or the signal received from the first mixer which has a delay of 90° with respect to the other signal, according to whether the frequency of the input signal is equal to f1 or f2.

The information contained in the phase shift relative to the output signal of the two low-pass filters is extracted by a phase detector which detects the advance or the delay of the signals with respect to each other and which supplies at its output a binary signal representative of the binary contents of the received FSK signal.

Usually, the digital phase detector is adapted to effectuate a comparison of the phase of the signals each time the value of one of these signals passes by zero. This amounts to sampling at a frequency 2*(f1–f2), a phase shift occuring at any instant thus being only detected at the moment of the first sampling instant following the phase shift. This signified that the output signal of the phase detector suffers from a certain "jitter". In these conditions, if the binary information flow BR carried by the received signal is substantially equal to or greater than the frequency shift f1–f2, there will only be on average one point or even less during the transmission of a bit of the received signal, which makes the correct demodulation of the transmitted binary message extremely difficult.

To obtain a considerable reduction of the "jitter" and in so doing, for a given error detection rate, considerably increase the binary flow being able to be detected, the document U.S. Pat. No. 4,322,851 suggests additionally producing from the first pair of analysis signals I and Q, at least a supplementary pair of analysis signals I' and Q' (and eventually other pairs I" and Q" etc.). Each of the pairs (I and Q, I' and Q') being in quadrature, and the signal pairs having a predetermined phase shift therebetween.

FIG. 1 is a schematic diagram of an FSK receptor according to the document U.S. Pat. No. 4,322,851. In this schematic a phase generator 101 is formed from a local oscillator 103 and a phase shift circuit 105. The phase shift circuit 105 receives from the oscillator 103 a sinusoidal signal and supplies at its output four analysis signals which have a frequency equal to that of the oscillator and which form two pairs in quadratures I, Q and I', Q'. These four signals are supplied by the phase generator 104 to four mixers 107a, 107b, 107c and 107d. Each of the mixers further receives at its input the FSK signal to be demodulated. The output signals from the mixers are transmitted to four low-pass filters 109a, 109b, 109c and 109d, before being amplified and then supplied to a phase detector 111. The output signal Z of the phase detector 111 is representative of the contents of the received FSK signal.

According to the configuration which has just been described, the phase detector 111 receives from the mixers 107 a number of signal pairs equal to the number of analysis signal pairs. The digital phase detector receiving at its input several pairs of out-of-phase signals, it detects more often the zero crossing of one of the signals, and it thus effectuate a phase comparison as often as the magnitude of the number of signal pairs. With four pairs of signals for example, the sampling frequency is four times greater and thus a four times smaller than with one single pair exists.

In order that the maximum time between two successive sampling instants is actually reduced in proportion to the increase of the number of pairs, and thus that the jitter is actually reduced, it is important that a phase generator produces pairs of analysis signals exactly in quadrature and having well determined phase shift therebetween.

The pairs of supplementary analysis signals I', Q', etc. may be produced, as is suggested by the document FR 2 538 634 by a linear combination of two signals I and Q of the base pair. FIG. 2 is a schematic diagram of a phase generator functioning by linearly combining two signals I and Q of a base pair of signals in quadrature. The phase generator 101 firstly comprises a local oscillator 103 connected to the input of a 90° phase shifter 120. The oscillator 103 and the phase shifter 120 together form a primary generator or generator circuit 121 supplying a pair of sinusoidal signals I and Q in quadrature. The signals I and Q produced then supplied to a plurality of pairs of multipliers 122a, 122b, etc, the function of which is to multiply the amplitude of the signals I and Q by the coefficients of the different linear combinations. The two output signals of each of the multiplier pairs are then added by addition circuit 124a, 124b to produce the different supplementary analysis signals I', Q'.

For example, a signal I' may be produced by creating the sum of the signal I and of the signal Q, and a signal Q' may be produced by creating the sum of the signal I and of the inverse of the signal Q (–Q). The signals of such a pair will be in quadrature and will have a phase difference of +45° and –45° with respect to the signal I.

In the case of a phase generator functioning by linear combinations of the base pair signals I and Q, the fact that the phase difference between the signals produced is well determined entirely depends upon whether the two analysis signals I and Q forming the base pair are exactly in quadrature and have equal amplitudes. This last point is not satisfactory resolved in known primary generators.

OBJECTS AND SUMMARY OF THE INVENTION

An aim of the present invention is thus to supply a phase difference and amplitude correction circuit which enables the correction with high precision of the phases and the amplitudes of two signals which are desired to be in quadrature and to have equal amplitudes.

Another aim of the present invention is to supply a generator circuit producing a pair of signals which are very precisely in quadrature and equal amplitudes.

The present invention has thus firstly as object a phase difference and amplitude correction circuit for two sinusoidal signals which are desired to be in quadrature and to have equal amplitude, said correction circuit comprising a first quadrature phase comparator intended to receive as input the two signals and to supply as output a first error signal the voltage of which is representative of the difference between the effective phase shift of the signals and 90°, means for adjusting the phase also being provided to, in response to said first error signal, correct the phase of at least one of said signals to re-establish a phase difference of 90° between the two signals, characterised in that said correction circuit further comprises analogue arithmetic processing means intended to supply two predetermined linear combinations of said signals, the respective coefficients of said predetermined linear combinations being chosen so that when said two signals are in quadrature and have equal amplitude, said linear combinations thereof are equal in quadrature and in that said correction circuit further comprises a second quadrature phase comparator intended to receive as input said two linear combinations and to supply as output a second error signal representative of the difference between the effective phase shift of said linear combination and 90°, amplitude adjustment means also being provided to, in response to said secondary signal, correct the amplitude of at least one of said signal to re-establish identical amplitudes to said signals.

As a result of these characteristics, the correction circuit verifies the quadrature relation existing between the signals of the base pair as well as the equality of their respective amplitudes. In fact, as, firstly, the correction circuit according to the invention includes phase adjustment means, which is now a phase shift of 90° between the signals of the base pair, and, secondly, the coefficients of the predetermined linear combinations are chosen so that when the two signals I and Q are in quadrature and have equal amplitudes the linear combinations are also in quadrature, the fact of detecting that the phase shift between the linear combinations is not equal to 90°, indicates that the amplitudes of the signals I and Q are not equal. In these conditions, the second error signal supplies to the amplitude adjustment means is representative of a difference between the amplitudes of the signals I and Q.

According to an advantageous embodiment of the present invention, said analogue arithmetic processing means include an analogue addition circuit and an analogue subtraction circuit, said two linear combinations of the signals being respectively the sum I+Q of the two signals and the difference I−Q of the two signals.

The present invention also has as its object a generator circuit supplying a pair of signals in quadrature and having equal amplitudes including a correction circuit according to claim 1 and two oscillators circuits respectively intended to supply said two sinusoidal signals, said phase generator being characterised in that a first of said oscillators is a voltage controlled oscillator connected so as to receive as control voltage said first error signal.

As a result of these characteristics, the generator circuit according to the invention is able to supply a pair of sinusoidal signals which are exactly in quadrature and have equal amplitudes. Such a generator circuit may advantageously be used as primary generator in the phase generator of an FSK receptor of the type represented in FIG. 1, to supply the base pair of analysis signals. In any event, the usefulness of the generator circuit of a pair of signals in quadrature and having equal amplitudes according to the invention is obviously not limited to this application.

BRIEF DESCRIPTION OF THE DRAWINGS

Other characteristics and advantages of the present invention will appear from the reading of the description which follows, given solely has an example and with reference to the attached drawings in which.

DESCRIPTION OF PREFERRED EMBODIMENTS

Figure 3:
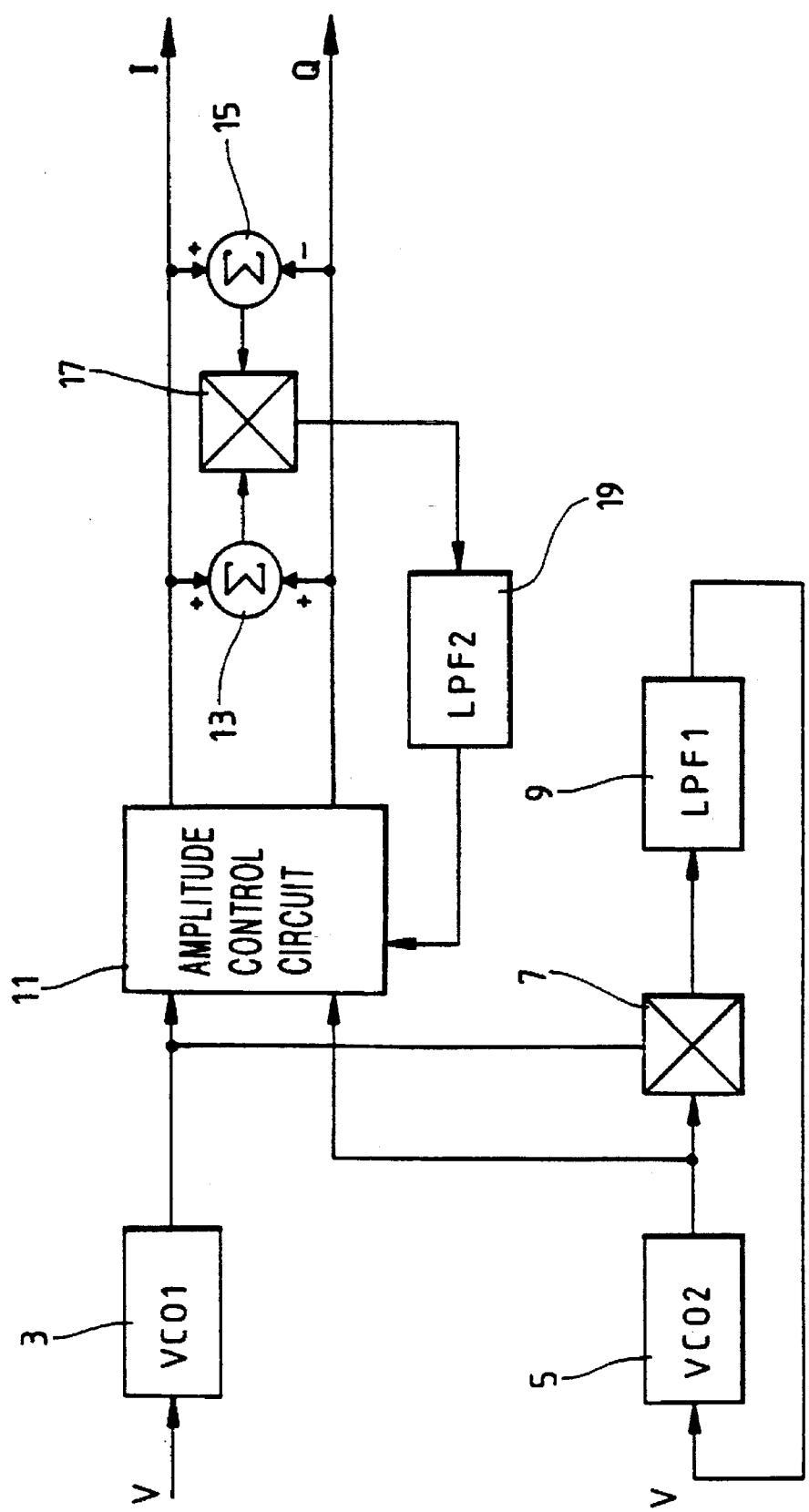
FIG. 3 is a schematic representation of a particular embodiment of a generator circuit according to the present invention intended to supply a pair of signals in quadrature and having equal amplitudes.

Referring now to FIG. 3, it will be seen that the generator circuit according to the present invention comprises two voltage controlled oscillators (VCO) respectively referenced 3 and 5. The control inputs of these oscillators are intended to receive respectively the control tensions V1 and V2. The output of each of the oscillators 3 and 5 is connected to one of the input of a first multiplier referenced 7, and the output of the multiplier 7 is connected, by a low-pass filter 9, to the voltage control input of one of the two oscillators (referenced 5).

The control voltage V1 supplied to the oscillator 3 determines the frequency of the signal which this latter supplies at its output. The frequency of the signal supplied by the second oscillator 5 is always the same as that of the oscillator 3. In fact, the loop which, according to what has been described previously, connects the oscillator 5 to the first multiplier 7, then to the low-pass filter 9, and which finally returns to the oscillator 5 via its voltage control input, constitutes a phase locked loop (PLL), the principle of which is well known to a person skilled in the art. During the operation of the phase generator, the presence of this phase locked loop, causes the slaving of the oscillator 5 to the frequency of the oscillator 3 but with a phase shift of 90° with respect to the oscillations of this latter. The signals I and Q respectively supplied at the output of the oscillators 3 and 5 will thus be in quadrature.

It would be also seen from FIG. 3 that the outputs of the oscillator 3 and 5 are also each connected to a connection line (not referenced) which, via an amplitude control circuit referenced 11, drives two analogue arithmetic circuits respectively referenced 13 and 15. In the present example, the two arithmetic circuits 13 and 15 are respectively an analogue adder and subtracter, and these two elements thus supply, at their outputs, respectively the sum and the difference of the signals I and Q that they receive from the connection lines. The output of each of the arithmetic circuits 13 and 15 is connected to one of the inputs of a second multiplier referenced 17, and the output of these multiplier is connected, via a second low-pass filter 19, to the control input of the amplitude control circuit 11.

The loop which, according what has just been described, connects the amplitude control circuit to the arithmetic circuits 13 and 15, then to the second multiplier 17, then to the low-pass filter 19 and which, finally, returns to the amplitude control circuit 11 via its control input, constitutes a phase locked loop the principle of which will now be described.

From mathematical principles it is known that, in order that two signals respectively equal to the sum and the difference of two initial signals in quadrature are themselves in quadrature, the amplitude of the two initial signals must be equal. Now, the presence of the phase locked loop (PLL) guaranties that the signals I and Q produced by the two oscillators (VCO) 3 and 5 are in quadrature. In these conditions if the signal from the second multiplier 17 and from the second low-pass filter 19 is not zero, the amplitudes of the signals I and Q produced by the two oscillators 3 and 5 are not equal. In an effort to equalise the amplitudes, the signal from the multiplier 17 and from the low-pass filter 19 is thus used as a control voltage in a feed-back loop for the amplitude control circuit 11. An example of the realisation of an amplitude control circuit will be described later in relation to FIG. 4.

The simultaneous presence of the phase locked loop and the amplitude locked loop assures that once they have crossed the amplitude control circuit, the signals I and Q supplied by the two oscillators 3 and 5 are in quadrature and have equal amplitudes. The circuit which has just been described is thus a generator circuit supplying a pair of signals in quadrature and having equal amplitudes.

Figure 1:
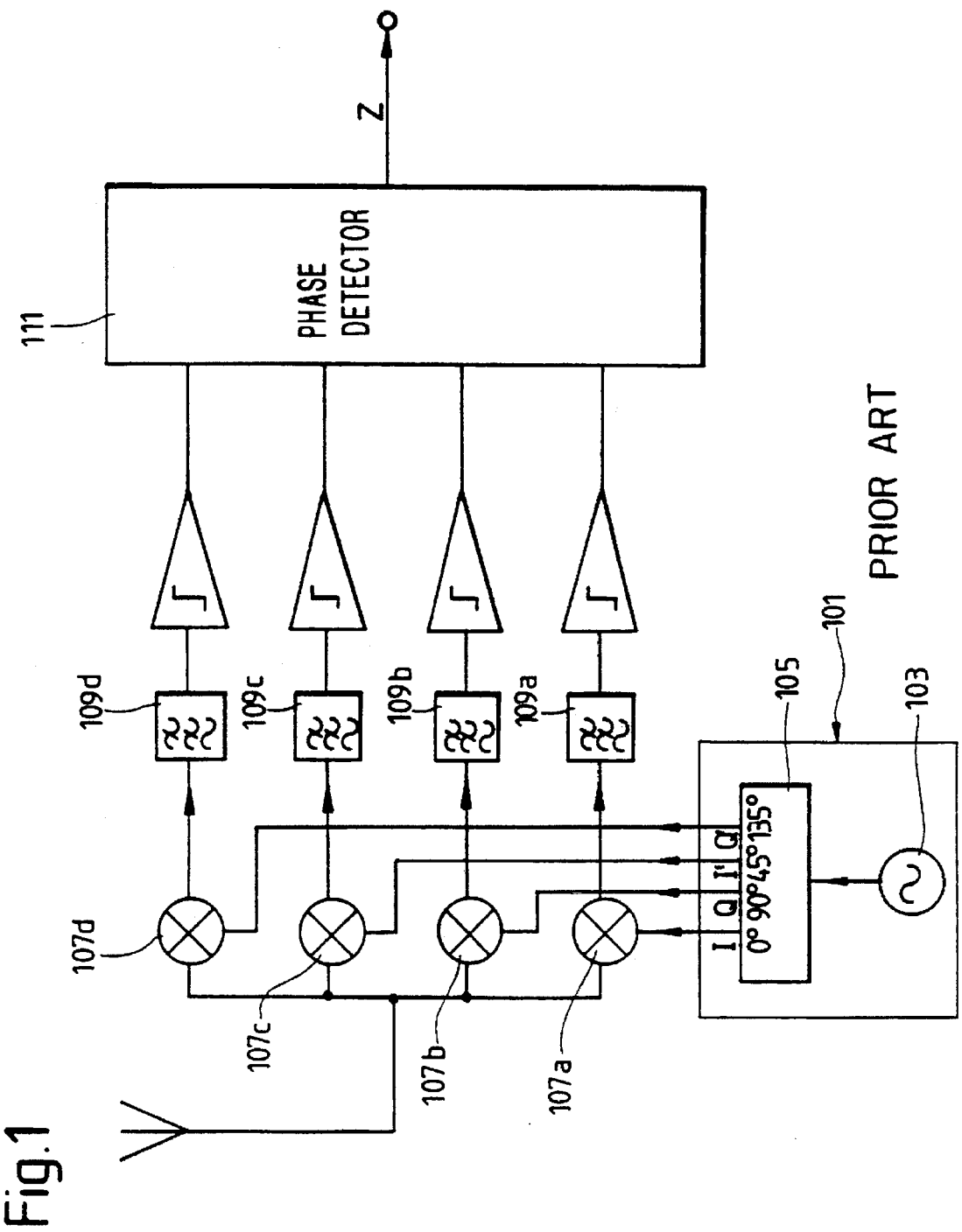
FIG. 1 is a schematic diagram of a known FSK receptor.
Figure 2:
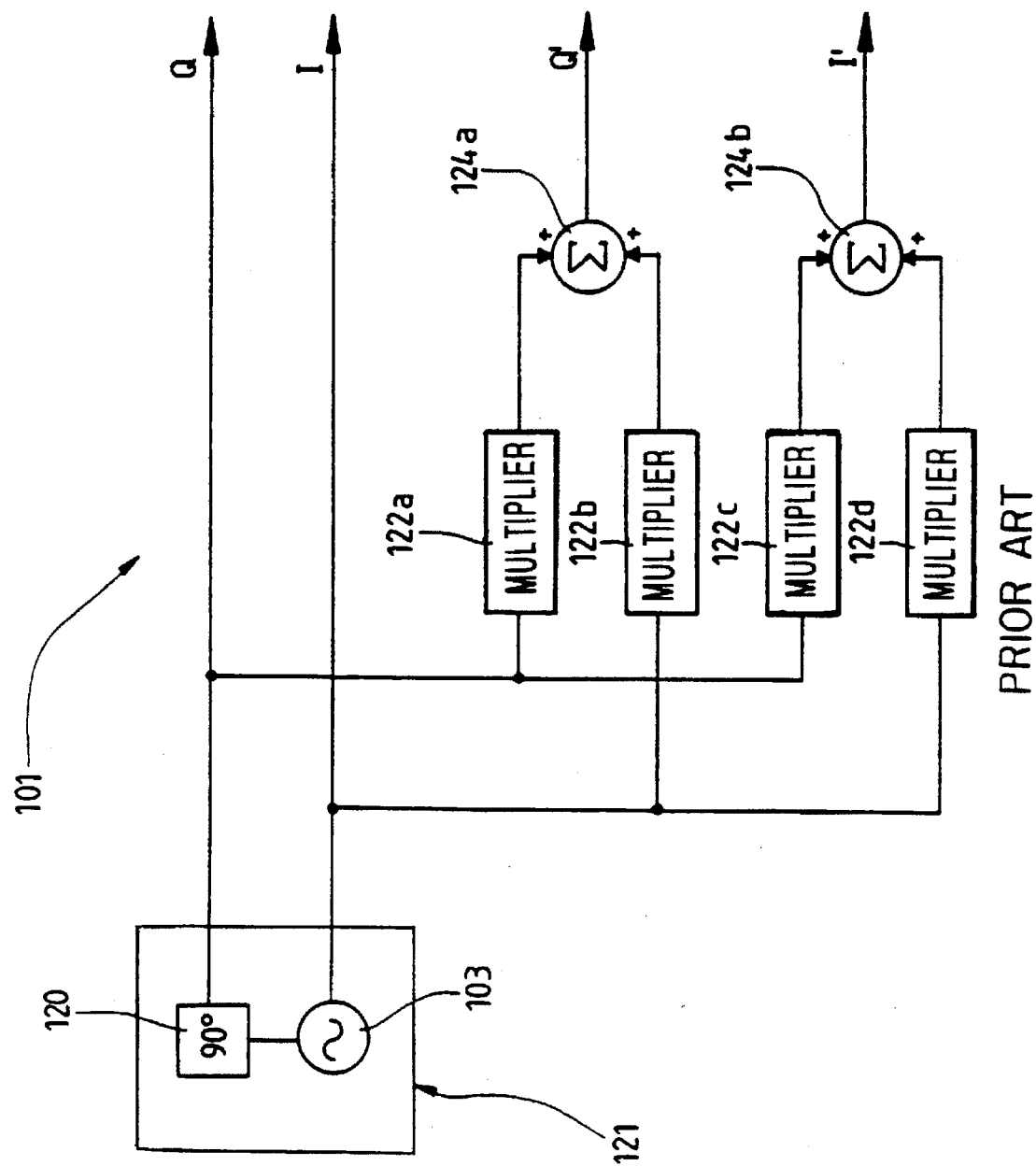
FIG. 2 is a schematic diagram of a phase generator operating by linearly combining the two signals of a base pair of signals in quadrature, and which is suitable for use in the receptor of FIG. 1.

A generator such as that which has just been described may for example advantageously replace the primary generator 121 of FIG. 2. The generator circuit according to the invention has in fact the advantage of supplying signals whose phases and amplitudes are more precisely defined than those of the signals produced in a known manner by a local oscillator 103 and a classical phase shifter 120. Further, the operation of the generator circuit according to the invention is independent of the frequency of the signal produced, which is generally not the case with classical devices.

Figure 4:
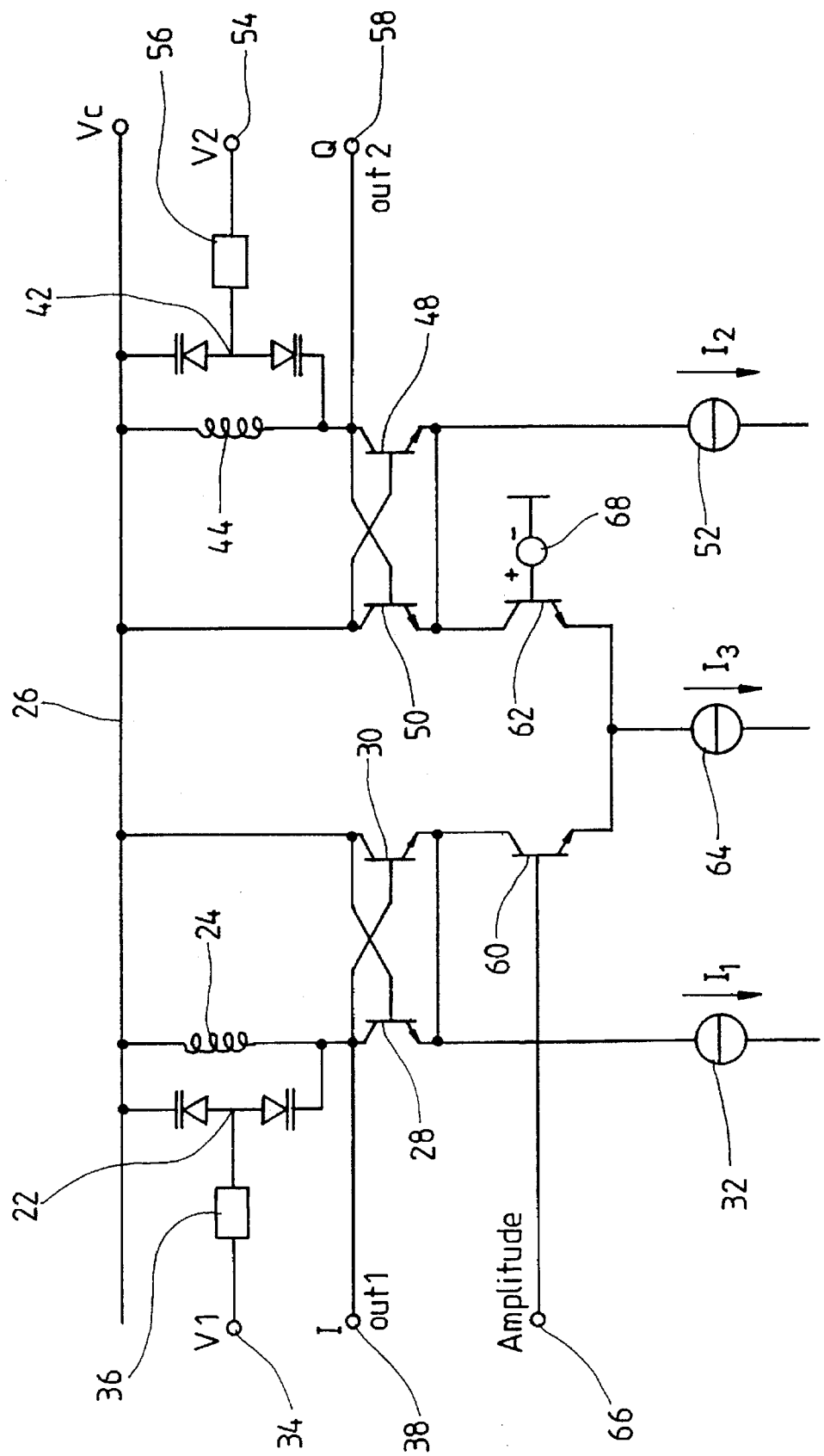
FIG. 4 is the schematic diagram of an example of an electronic circuit integrating the two voltage controlled oscillators and the amplitude control circuit which are represented in FIG. 3.

In FIG. 4, an electronic circuit has been represented integrating the two voltage control oscillator referenced 3 and 5 in FIG. 3 and the amplitude control circuit referenced 11 in FIG. 3.

The first voltage control oscillator is formed by a varicap diode 22 connected in parallel with an inductance 24 between a positive power supply line 26 and the collector of a bipolar transistor 28. The collector of the transistor 28 is also connected to the base of a second bipolar transistor 30 and these two transistors are coupled by their emitters and connected thereby to a current source 32. Finally the base of the transistor 28 and the collector of the transistor 30 are connected to the power supplying line 26. It can also be seen from FIG. 4 that the control input of the varicap diode 22 is connected to the liaison node 34 via a resistance 36, and that the collector of the bipolar transistor 28 is connected to another liaison node 38.

The loop formed by the connection in parallel of the varicap diode 22 and the inductance 24 constitutes a resonant circuit LC, and the frequency of resonance of the circuit depends, in the usual manner, on the voltage supplied to the node 34 to control the capacitance of the varicap diode. The two transistors 28 and 34 and the current source 32 together form, in a known manner, an amplifier element intended to maintain the oscillations of the loop LC. Further, the gain of this amplifier element, and thus the amplitude of the oscillations in the loop, depend directly on the current crossing the coupled emitters of the transistors 28 and 30. As a result of the connection which has just been described, the signal supplied by the oscillator to the node 38 will have an amplitude which is a function of the current transfered in the coupled emitters of the transistors 28 and 30, and a frequency which is a function of the voltage supplied to the varicap diode via the node 34.

A varicap diode 42, an inductance 44, bipolar transistors 48 and 50 and a current source 52 together form the second voltage control oscillator. The operation of the second oscillator is identical to that of the first.

The amplitude control circuit is formed by two bipolar transistors 60 and 62 the emitters of which are connected together to a third current source 64. The collector of the first transistor 60 is connected, in parallel with the current source 32, to the emitters of the two transistors 28 and 30 of the first oscillator, and the collector of the second transistor 62 is connected in the same manner to the emitters of two transistors 48 and 50 of the second oscillator. Finally, the base of the transistor 60 is connected to a liaison node 66, and the base of the transistor 62 is connected to a constant voltage source 68.

The transistor 60 being connected in parallel with the current source 32, the determining current which fixes the amplitude of the oscillations in the first oscillator is not simply the current crossing the current source 32, but the sum of this current and the current crossing the transistor 60. In a similar manner, the determining current which fixes the amplitude of the oscillations in the second oscillator is the sum of the current crossing the current source 52 and the current crossing the transistor 62. Further, the emitters of the transistors 60 and 62 being, as has previously been stated, connected together to the current source 64, the sum of the current crossing the transistors 60 and 62 is equal to the current crossing the current source 64, and the relation between the current crossing the transistor 60 and the current crossing the transistor 62 thus depends on the difference between the voltage supplied to the base of the transistor 60 via the node 66 and the fixed voltage supplied to the base of the transistor 62 by the current source 68.

According to the arrangement which has just been described, it is possible to control the relation between the amplitudes of the signals respectively supplied to the nodes 38 and 58 by acting on the voltage supplied to the node 66.

The circuit which has just been described in relation with FIG. 4 constitutes an example of the oscillators and the amplitude control circuit represented in FIG. 3. It should be noted however that these elements may naturally be realised in other manners. In particular, it is possible that the amplitude control circuit 11 (FIG. 3) only act on one of the signals I or Q.

What is claimed is:

1. A circuit for generating two sinusoidal signals in quadrature and having equal amplitudes, said correction circuit, comprising a first quadrature phase comparator connected to receive as input two signals and to supply as output a first error signal the voltage of which is representative of the difference between the phase difference between the two signals and 90°, phase adjustment means responsive to said first error signal for correcting the phase of at least one of said two signals to maintain a phase difference of 90° between them, analogue arithmetic processing means for supplying two linear combinations of said two signals, a second quadrature phase comparator connected to receive as input said two linear combinations and to supply as output a second error signal representative of the difference between the phase difference between said linear combinations and 90°, the respective coefficients of said linear combinations being chosen so that, when said two signals are in quadrature and have equal amplitudes, said second error signal indicates zero error, and amplitude adjustment means responsive to said second error signal, for correcting the amplitude of at least one of said two signals for maintaining said two signals at identical amplitudes.

2. Correction circuit according to claim 1, wherein said analogue arithmetic processing means include an analogue addition circuit and an analogue subtraction circuit, said two linear combinations of said two signals being respectively the sum of the two signals and the difference of the two signals.

3. Correction circuit according to claim 1, wherein said first and second quadrature phase comparators each include a multiplier and a low-pass filter connected to the output of said multiplier.

4. The circuit of claim 1 further including first and second oscillators respectively supplying said two sinusoidal signals, wherein a first of said oscillators is a voltage controlled oscillator, connected to receive said first error signal as a control voltage.

5. A generator circuit for supplying a pair of sinusoidal signals in quadrature and having equal amplitudes, comprising:

a first and a second oscillator supplying respectively as outputs a first and a second sinusoidal signal, said second oscillator being a voltage controlled oscillator, a first quadrature phase comparator receiving as input said first and second signals and supplying as output a first error signal representative of the difference between the phase difference between said two signals and 90°, said first error signal being supplied to said second oscillator to correct the phase of the output thereof, first and second analogue arithmetic processing units each receiving as input said pair of signals and supplying respectively as output the sum and the difference thereof, a second quadrature phase comparator receiving as input said sum and said difference and supplying as output a second error signal representative of the difference between the phase difference between said inputs and 90°, and an amplitude adjustment circuit responsive to said secondary signal, to correct the amplitude of at least one of said oscillators to maintain said two signals at equal amplitudes.

\* \* \* \* \*